(12) United States Patent
Skifton et al.

(10) Patent No.: US 11,963,446 B2
(45) Date of Patent: Apr. 16, 2024

(54) METHODS FOR MAKING HIGH-TEMPERATURE THERMOCOUPLES

(71) Applicant: Battelle Energy Alliance, LLC, Idaho Falls, ID (US)

(72) Inventors: Richard S. Skifton, Idaho Falls, ID (US); Alma J. Palmer, Idaho Falls, ID (US); Kurt Davis, Idaho Falls, ID (US); Joshua Daw, Idaho Falls, ID (US); Pattrick Calderoni, Idaho Falls, ID (US)

(73) Assignee: Battelle Energy Alliance, LLC, Idaho Falls, ID (US)

( * ) Notice: Subject to any disclaimer, the term of this patent is extended or adjusted under 35 U.S.C. 154(b) by 1078 days.

(21) Appl. No.: 16/712,629

(22) Filed: Dec. 12, 2019

(65) Prior Publication Data

US 2020/0194652 A1 Jun. 18, 2020

Related U.S. Application Data

(60) Provisional application No. 62/779,354, filed on Dec. 13, 2018.

(51) Int. Cl.
| | | |
|---|---|---|
| *H10N 10/01* | (2023.01) | |
| *C21D 9/52* | (2006.01) | |
| *G01K 15/00* | (2006.01) | |
| *G01R 19/03* | (2006.01) | |
| *H01B 13/00* | (2006.01) | |

(Continued)

(52) U.S. Cl.
CPC ............... *H10N 10/01* (2023.02); *C21D 9/52* (2013.01); *G01K 15/005* (2013.01); *G01R 19/03* (2013.01); *H01B 13/0016* (2013.01); *H10N 10/17* (2023.02); *H10N 10/854* (2023.02)

(58) Field of Classification Search
CPC combination set(s) only.
See application file for complete search history.

(56) References Cited

U.S. PATENT DOCUMENTS 3,066,177 A * 11/1962 Accinno ............... H10N 10/854
136/227
3,673,003 A * 6/1972 Starr .................... H10N 10/854
136/239

(Continued)

OTHER PUBLICATIONS

Dew, J. et al., J. of Power and Energy Systems, vol. 2, 2008, pp. 854-863. (Year: 2008).*

(Continued)

*Primary Examiner* — Peter Dungba Vo
*Assistant Examiner* — Jose K Abraham
(74) *Attorney, Agent, or Firm* — TraskBritt

(57) ABSTRACT

Methods of manufacturing thermocouples having a first thermoelement wire comprises a molybdenum-lanthanum based material and a second thermoelement wire comprises a phosphorus-doped niobium, may involve exposing a first thermoelement wire and a second thermoelement wire to a temperature in a range extending from about 50° C. to about 60° C. above an intended operational temperature of the first and second thermoelement wires and until a rate of change of a normalized voltage output of the first thermoelement wire and the second thermoelement wire is about 0.001 normalized Volts per hour or less.

20 Claims, 3 Drawing Sheets

(51) Int. Cl.
*H10N 10/17* (2023.01)
*H10N 10/854* (2023.01)

(56) References Cited

U.S. PATENT DOCUMENTS

| | | | | |
|---|---|---|---|---|
| 3,776,781 | A * | 12/1973 | Starr | H10N 10/855 136/239 |
| 3,972,740 | A * | 8/1976 | Starr | G01K 7/04 136/239 |
| 4,749,546 | A * | 6/1988 | Burley | C22C 19/056 420/443 |
| 4,834,807 | A * | 5/1989 | Burley | H10N 10/01 420/443 |
| 5,010,316 | A * | 4/1991 | Burley | H10N 10/854 219/544 |
| 5,043,023 | A * | 8/1991 | Bentley | H10N 10/854 136/239 |
| 5,520,461 | A * | 5/1996 | Curry | G01K 1/10 374/208 |
| 7,871,198 | B2 | 1/2011 | Rempe et al. | |
| 2008/0205483 | A1 * | 8/2008 | Rempe | G01K 7/02 374/E7.004 |

OTHER PUBLICATIONS

Caldwell, "Thermocouple Materials", U.S. Department of Commerce, National Bureau of Standards Monograph 40, (Mar. 1962) 51 pages.

Rempe et al., "Thermocouples for High Temperature In-Pile Testing", ANS 2005 Winter Meeting, INL/CON-05-00455 Preprint (Nov. 2005) 3 pages.

Skifton et al., "Optimization of heat treatment and calibration procedures for high temperature irradiation resistant thermocouples", Instrumentation Science & Technology, vol. 46, No. 4, (2018) pp. 349-363.

* cited by examiner

METHODS FOR MAKING HIGH-TEMPERATURE THERMOCOUPLES

CROSS-REFERENCE TO RELATED APPLICATION

This application claims the benefit of U.S. Provisional Patent Application Ser. No. 62/779,354, filed Dec. 13, 2018, the disclosure of which is hereby incorporated herein in its entirety by this reference.

STATEMENT REGARDING FEDERALLY SPONSORED RESEARCH OR DEVELOPMENT

This invention was made with government support under Contract Number DE-AC07-05-ID14517 awarded by the United States Department of Energy. The government has certain rights in the invention.

FIELD

Embodiments of the disclosure relate generally to methods of fabricating, including heat treating and calibrating, a thermocouple capable of long term operation in hostile high temperature environments without significant signal degradation.

BACKGROUND

The accurate measurement of temperatures between 1200° C. and 1800° C. is important to the safe, efficient and economical operation of many industries including, but not limited to, electrical power production, processing and refining of chemicals, the fabrication of steel and other metals, and production of glass and ceramic materials. Accurate temperature measurement over time can also be critical to the operation of industrial machinery such as jet engines, nuclear reactors, gasification units, incinerators, and gas turbines. In such temperature environments, thermocouples are the most widely used industrial temperature sensors because they are rugged, affordable and accurate—at least initially.

Unfortunately, after installation commercial thermocouples may become unstable in the foregoing temperature range and prone to decalibration or "drift," providing increasingly unreliable and unpredictable readings as they age. As operating temperatures and the number of thermal cycles increase, the performance of these thermocouples decreases. Together, these factors often result in costly redundant instrument clusters, sensor failures, downtime and potential accidents due to undetected overheating. For temperatures above 1100° C. in radiation environments, such as in high-temperature nuclear test reactors, conventional thermocouples are incapable of stable and accurate operation.

The thermocouple of the present invention overcomes the two most critical thermocouple issues plaguing high-temperature operations—signal drift and sensor longevity. The first problem with all conventional thermocouple sensors is that they are subject to decalibration. The uncertainties surrounding decalibration are difficult to quantify, but elevated temperatures and longer operating times inevitably result in increasingly unreliable measurements. Conventional thermocouples drift appreciably after a few hundred hours of use, making accurate temperature measurement and high-temperature process control difficult without frequent sensor change out. For high-temperature nuclear applications there are even greater limitations. Currently there are no high-temperature thermocouples capable of withstanding neutron flux in nuclear fission reactors or, potentially one day, fusion reactors. The key to minimizing drift lies in selecting thermocouple materials with properties that do not interact with each other or appreciably change during use.

A second problem is that prolonged heating, contamination, and thermal cycling increases material brittleness and fragility and shortens thermocouple life. Most metals, including those used in thermocouples, become brittle with high temperature exposure; as a result, they can fail due to mechanical stresses induced by vibrations, expansion, and contraction. Heat from welding to form conventional thermocouple junctions also can lead to mechanical failure from embrittlement. Compatibility of component metals at high temperature and improved joining methods are essential to improved thermocouple durability.

BRIEF SUMMARY

Embodiments disclosed herein may include a thermocouple and a method of manufacturing the thermocouple involving exposing a first thermoelement wire and a second thermoelement wire to a temperature in a range extending from about 50° C. to about 60° C. above an intended operational temperature of the first and second thermoelement wires until a rate of change of a normalized voltage output of the first thermoelement wire and the second thermoelement wire is about 0.001 normalized Volts per hour or less, such as for a duration in a range extending from about 4 hours to about 6 hours.

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

DETAILED DESCRIPTION

Figure 1:
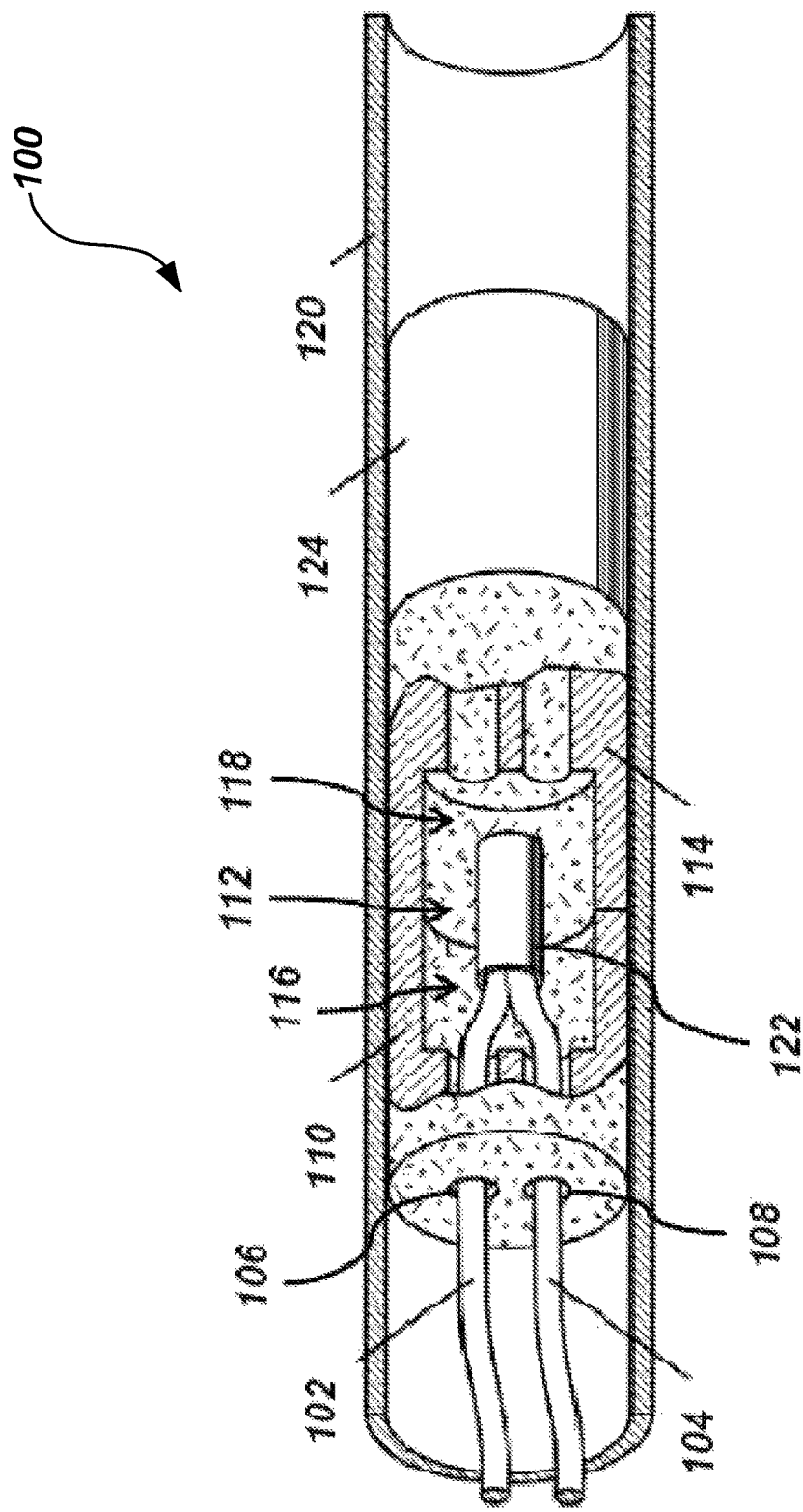
FIG. 1 is a partial cutaway side view of a thermocouple according to embodiments of the disclosure.

The illustrations included herewith are not meant to be actual views of any particular material, component, or system, but are merely idealized representations that are employed to describe embodiments of the disclosure.

The following description provides specific details, such as material types and processing conditions, in order to provide a thorough description of embodiments described herein. However, a person of ordinary skill in the art will understand that the embodiments disclosed herein may be practiced without employing these specific details. Indeed, the embodiments of the disclosure may be practiced in conjunction with conventional fabrication techniques employed in the industry. In addition, the description provided below does not form a complete process flow, apparatus, or system for forming a thermocouple, a component of a thermocouple, or related methods. Only those process acts and structures necessary to understand the embodiments of the disclosure are described in detail below. Additional acts to form a thermocouple or a component of a thermocouple may be performed by conventional techniques. Further, any drawings accompanying the present application are for illustrative purposes only and, thus, are not drawn to scale.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, even at least 99.9% met, or even 100.0% met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, the term "may" with respect to a material, structure, feature, or method act indicates that such is contemplated for use in implementation of an embodiment of the disclosure, and such term is used in preference to the more restrictive term "is" so as to avoid any implication that other compatible materials, structures, features and methods usable in combination therewith should or must be excluded.

As used herein, the singular forms following "a," "an," and "the" are intended to include the plural forms as well, unless the context clearly indicates otherwise.

As used herein, any relational term, such as "first," "second," "over," "above," "below," "up," "down," "upward," "downward," "top," "bottom," "top-most," "bottom-most," and the like, is used for clarity and convenience in understanding the disclosure and accompanying drawings and does not connote or depend on any specific preference, orientation, or order, except where the context clearly indicates otherwise.

As used herein, the term "configured" refers to a size, shape, material composition, orientation, and arrangement of one or more of at least one structure and at least one apparatus facilitating operation of one or more of the structure and the apparatus in a pre-determined way.

The disclosure relates to a thermocouple capable of use and operation for long (e.g., extended) periods of time in a high temperature, hostile environment including, but not limited to, a neutron flux environment without significant signal degradation and without significant (e.g., less than 2%) decalibration, or "drifting." For instance, the thermocouple of the disclosure is capable of use and operation for up to 4000 hours at temperature between 1100° C. and 1800° C. without significant drifting. The thermocouple is further capable of withstanding multiple thermal cycles and thermal transients of 500° C./minute or greater without significant drifting. A cross-sectional view of a thermocouple 100 according to the present disclosure is illustrated in FIG. 1.

The thermocouple 100 includes a first thermoelement wire 102 and a second thermoelement wire 104 threaded (e.g., extending) through apertures 106, 108 of a first insulating member 110. The first and second thermoelement wires 102, 104 may be coupled together by a thermocouple junction 112. Each of the first insulating member 110 and a second insulating member 114 includes a respective cavity 116, 118 such that when the first and second insulating members 110, 114 are joined, the thermocouple junction 112 may be housed (e.g., retained, enclosed) within the cavities 116, 118. The assembled first and second thermoelement wires 102, 104, the thermocouple junction 112, and the first and second insulating members 110, 114 may be disposed in a protective sheath 120.

The first and second thermoelement wires 102, 104 may include and/or be formed from dissimilar materials. In other words, the first thermoelement wire 102 may have a material composition different from a material composition of the second thermoelement wire 104. In some embodiments, the first and second thermoelement wires 102, 104 may each include and/or be formed from refractory metal-based alloys. The first thermoelement wire 102 may include and be formed of a molybdenum-lanthanum based alloy. In some embodiments, about 99.95 wt % of the first thermoelement wire 102 may include and/or be formed from a molybdenum-lanthanum metal. A remainder of the first thermoelement wire 102 composition may include one or more additives (e.g., impurities) including, but not limited to, metals (e.g., Fe, Ni, Cr, Al, Ca, etc.) and nonmetals (e.g., Si, Cr, O, etc.). The molybdenum-lanthanum metal may include between about 0.5 wt % and about 1.0 wt % of lanthanum oxide and between about 98.95 wt % and about 99.45 wt % molybdenum. Molybdenum is an excellent refractory metal but recrystallizes upon heating about 1200° C. The addition of lanthanum to molybdenum increases the recrystallization temperature to above 1600° C. The addition of lanthanum also increases the ductility of molybdenum particularly at high temperatures. The second thermoelement wire 104 may include phosphorus-doped niobium. Niobium has excellent ductility, a high melting temperature, and a low neutron absorption. In some embodiments, the second thermoelement wire 104 may include between about 99.5 wt % about 99.8 wt % niobium and between about 490 ppm and 1000 ppm phosphorus.

The thermocouple junction 112 may include a metallic tube 122 swaged onto the first and second thermoelement wires 102, 104. The use of a swaged metallic tube 122, such as tantalum tubes, to form the thermocouple junction 112 may eliminate a need for a welded junction, which have a tendency to become brittle and mechanically unstable at higher temperatures.

The insulating materials of the thermocouple 100, such that the first, second, and third insulating members 110, 114, 124 may exhibit a high electrical resistivity and does not interact chemically with the thermoelement wires or sheath materials. Even small changes in thermoelement composition may result in decalibration or miscalibration. Such changes are often due to temperature-induced migration of impurities from the sheath and insulation to the thermoelement wires. For conventional thermocouples, metal/insulation interactions are one cause of drift, but at 1600° C., reaction kinetics make material interactions difficult to avoid. Minimizing component material interactions may aid in minimizing thermocouple drift. In some embodiments, the insulating materials may include aluminum oxide (hereafter "alumina").

The protective sheath 120 may include another metallic tube that is swaged onto the first and second thermoelement wires 102, 104, the thermocouple junction 112, and the insulating members 110, 114, 124. The protective sheath 120 may include and be formed of a material that does not react with the insulating materials of the thermocouple 100. In some embodiments, the protective sheath 120 may include and be formed of a niobium-zirconium alloy and includes 99 wt % niobium and 1 wt % zirconium.

Figure 2:
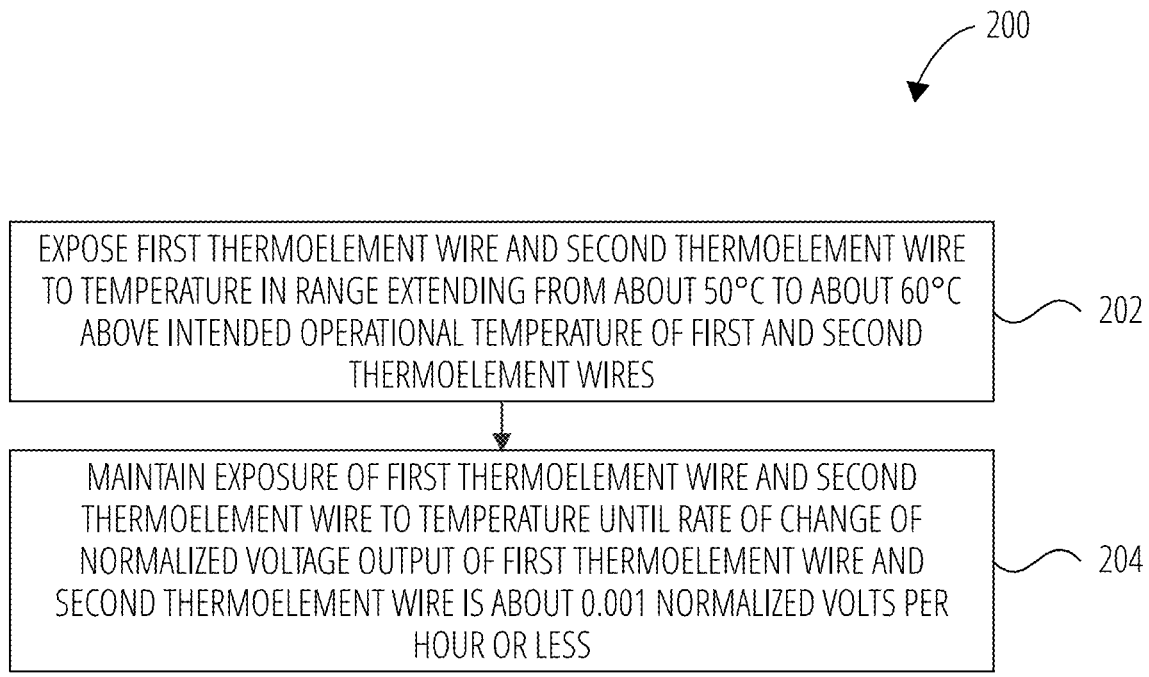
FIG. 2 is a flowchart of a method of forming thermocouples in accordance with this disclosure.

FIG. 2 is a flowchart of a method 200 of forming thermocouples in accordance with this disclosure. Methods of forming the thermocouple 100 may include a preconditioning heat treatment process. In some embodiments, the heat treatment is applied to the first and second thermoelement wires 102, 104 prior to assembly of the first and second thermoelement wires 102, 104 to form the thermocouple 100. The heat treatment may involve heating at least the first and second thermoelement wires 102, 104 in a furnace at a temperature greater than an intended operational temperature of the thermocouple 100. In other words, the first and second thermoelement wires 102, 104 are exposed to a temperature greater than an anticipated temperature to which the first and second thermoelement wires 102, 104 will be exposed during operation of the thermocouple 100. The first and second thermoelement wires 102, 104 are exposed to a temperature that is in a range from about 50° C. to about 60° C. greater than the intended operational temperature of the thermocouple or, for example, about 50° C. greater than the intended operational temperature of the thermocouple 100, as indicated at act 202. In some embodiments, the thermocouple 100 is used in nuclear reactors. In such embodiments, the thermocouple 100 may be heated in an environment reaching temperatures in a range extending from about 1100° C. to about 1600° C. Accordingly, the heat treatment includes heating the first and second thermoelement wires 102, 104 at a temperature in a range extending from about 1150° C. to about 1650° C. In some embodiments, the thermoelement wires may be exposed to a temperature between about 50° C. and about 60° C. greater than the maximum expected operating temperature of the thermocouple 100. For example, the first and second thermoelement wires 102, 104 may be heated to a temperature of about 1650° C.

Figure 3:
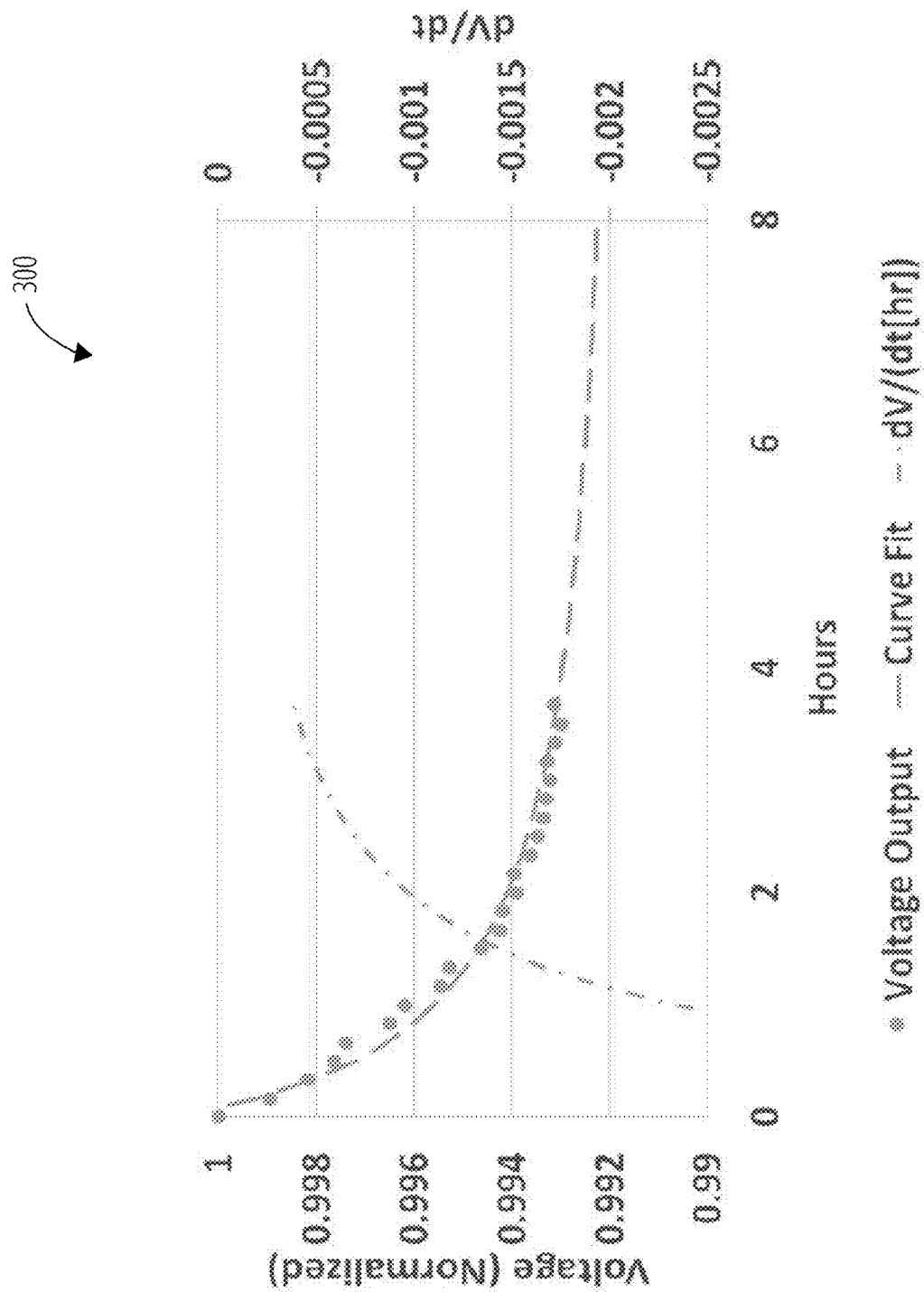
FIG. 3 is a graph illustrating a voltage output of a thermocouple during heat treatment in accordance with this disclosure over time.

FIG. 3 is a graph 300 illustrating a voltage output of a thermocouple during heat treatment in accordance with this disclosure over time. With collective reference to FIG. 1, FIG. 2, and FIG. 3, a voltage output of the first and second thermoelement wires 102, 104 may be measured during the heat treatment utilizing a voltmeter to assist in determining whether the heat treatment is sufficiently complete. The actual voltage output of the first and second thermoelement wires 102, 104 has been normalized with respect to the initial voltage output (e.g., the maximum voltage output), such as, for example, by dividing the actual voltage output by the initial voltage output (e.g., the maximum voltage output). As shown in FIG. 3, the voltage output decreased over time, with earlier changes in voltage occurring more rapidly and at greater voltage values than later changes in voltage as heat treatment continued. The rate at which voltage output from the first and second thermoelement wires 102, 104 changes with respect to time may be monitored, and may be used as one indicator of beneficial completion of heat treatment.

For example, the first and second thermoelement wires 102, 104 may remain exposed to conditions of heat treatment until a rate of change of a normalized voltage output of the first thermoelement wire 102 and the second thermoelement wire 104 falls below a predefined threshold. More specifically, the first and second thermoelement wires 102, 104 may remain exposed to temperatures greater than an intended operational temperature of the thermocouple 100 until a rate of change of a normalized voltage output of the first thermoelement wire and the second thermoelement wire is about 0.001 normalized Volts per hour or less, as indicated at act 204 in FIG. 2. As a specific, nonlimiting example, the first and second thermoelement wires 102, 104 may remain exposed to a temperature that is in a range from about 50° C. to about 60° C. greater than the intended operational temperature of the thermocouple 100 until a rate of change of a normalized voltage output of the first thermoelement wire and the second thermoelement wire is between about 0.001 normalized Volts per hour and about 0.0001 normalized Volts per hour.

In some embodiments, the first and second thermoelement wires 102, 104 may be exposed to and maintained at exposure to the temperature for a duration in a range extending from about 4 hours to about 6 hours and, more particularly, may be heated for about 4 hours or more.

After heat treatment, the first and second thermoelement wires 102, 104 are cooled to room temperature. In some embodiments, a furnace having an isothermal heating zone is used to heat treat the first and second thermoelement wires 102, 104.

At least a portion of the first and second thermoelement wires 102, 104 may be subjected to the foregoing heat treatment. In some embodiments, at least a portion of each of the first and second thermoelement wires 102, 104 to be subject to a thermal gradient of at least 60° C. during operation of the thermocouple 100 may be subject to the foregoing heat treatment. In other embodiments, an entire length of the first and second thermoelement wires 102, 104 may be subject to the heat treatment. The heat treatment may be applied to the first and second thermoelement wires 102, 104 in segments such that less than an entire length of the first and second thermoelement wires 102, 104 is heated at one time, or the heat treatment may be applied to the first and second thermoelement wires 102, 104 in whole such that an entire length of the first and second thermoelement wires 102, 104 is heated at one time.

To form the thermocouple 100, the first and second thermoelement wires 102, 104 may be disposed in respective apertures 106, 108 of the first insulating member 110. In some embodiments, the first and second thermoelement wires 102, 104 may be subject to the heat treatment as previously described prior to being disposed within the first insulating members 110. After the first and second thermoelement wires 102, 104 are passed through the apertures 106, 108, the first and second thermoelement wires 102, 104 may be coupled together by providing a piece of insulation (not shown) between the first and second thermoelement wires 102, 104 and swaging a metallic tube 122 onto ends of the first and second thermoelement wires 102, 104. The piece of insulation may include alumina insulation and may be provided to prevent undesirable contact and crushing of the first and second thermoelement wires 102, 104 when the first and second thermoelement wires 102, 104 are coupled by the metallic tube 122. The second insulating member 114 is provided in contact with the first insulating member 110 such that the metallic tube 122 and at least a portion of the first and second thermoelement wires 102, 104 are disposed in the cavities 116, 118. The assembled first and second thermoelement wires 102, 104 disposed within the first and second insulating members 110, 114 may be disposed in protective sheath 120. In some embodiments, a third insulating member 124 may be provided adjacent the second insulating member 114 within the protective sheath 120.

In embodiments, in which the first and second thermoelement wires 102, 104 were not previously heat treated prior to fabrication of thermocouple 100, the first and second thermoelement wires 102, 104, the metallic tube 122, the insulating members 110, 114, 124, and the protective sheath 120 may be subject to the heat treatment as previously described herein.

Prior to operation of the thermocouple 100, the thermocouple 100 may be calibrated. Methods of calibrating the thermocouple 100 according to this disclosure are described in an article authored by three of the inventors and published as Richard Skifton et al., Optimization of heat treatment and calibration procedures for high temperature irradiation resistant thermocouples, 46 Instrumentation Science and Technology 349 (2018). In other embodiments, the thermocouple 100 may be calibrated substantially in accordance with ASTM standard E220, "Standard Test Method for Calibration of Thermocouples By Comparison Techniques." To calibrate the thermocouple 100, the thermocouple 100 is provided in a furnace opposite a previously calibrated thermocouple, such as a Type B thermocouple. The thermocouples are connected to a voltmeter or other device configured to measure voltage or electromotive force passing through the thermocouples. The thermocouple 100 is provided with a constant reference temperature point. In some embodiments, a portion of the thermocouple 100 is provided in an ice-point cell, or an ice bath, which provides the reference temperature point. Another portion of the thermocouple 100 is subject to a varying temperature within the furnace. The temperature within the furnace may be increased in preselected temperature intervals extending in a range from about 700° C. to about 1400° C. and may be subsequently decreased in substantially the same preselected temperature intervals. Each preselected temperature is maintained for 1 hour during which time and voltage measurements are recorded. Approximately 1800 voltage measurements are taken at each temperature. To calibrate the thermocouple 100 for temperatures of less than 700° C., a portion of the thermocouples may be disposed in a boiling water bath at a temperature of about 95° C. to provide the reference temperature point and another portion of the thermocouples is subject to varying temperatures including an ice-point cell, ambient room temperature (e.g., about 20° C.), and a palm of a closed fist. As the temperature is varied, time and voltage measurements are recorded as previously described. Voltage measurements recorded at each temperature for the thermocouple 100 are time averaged and compared. If the voltage measurements of the thermocouple 100 vary by more than 1.5% at the same temperature reading taken as the furnace temperature was increased and as the furnace temperature was decreased, the thermocouple 100 is rejected as defective. If the voltage measurements of the thermocouple 100 do not vary, the recorded voltage measurements may be plotted as a function of time and may be fit to a linear trend line or to a calibration curve. In operation, the thermocouple 100 is used to measure voltage, and the measured voltage is related to a temperature using the calibration curve.

Long duration tests in a high-temperature furnace at the Idaho National Laboratory (INL) demonstrate that the present invention remains stable with less than 2% drift after operating 4,000 hours at 1200° C. The thermocouple 100 offers a twenty-fold performance improvement in resistance to drift over conventional thermocouples.

While certain illustrative embodiments have been described in connection with the figures, those of ordinary skill in the art will recognize and appreciate that the scope of this disclosure is not limited to those embodiments explicitly shown and described in this disclosure. Rather, many additions, deletions, and modifications to the embodiments described in this disclosure may be made to produce embodiments within the scope of this disclosure, such as those specifically claimed, including legal equivalents. In addition, features from one disclosed embodiment may be combined with features of another disclosed embodiment while still being within the scope of this disclosure, as contemplated by the inventors.

What is claimed is:

1. A method of manufacturing a thermocouple, comprising:
   exposing a thermocouple junction comprising a first thermoelement wire and a second thermoelement wire to a temperature in a range extending from 50° C. to 60° C. above an intended operational temperature of the first and second thermoelement wires and until a rate of change of a normalized voltage output of the first thermoelement wire and the second thermoelement wire is 0.001 normalized Volts per hour or less than 0.001 normalized Volts per hour, wherein the first thermoelement wire comprises a molybdenum-lanthanum based material and the second thermoelement wire comprises a phosphorus-doped niobium.

2. The method of claim 1, wherein exposing the thermocouple junction comprising first thermoelement wire and the second thermoelement wire to the temperature comprises exposing the thermocouple junction comprising the first and second thermoelement wires to a temperature of 1650° C.

3. The method of claim 1, wherein exposing the thermocouple junction comprising the first thermoelement wire and the second thermoelement wire to the temperature comprises subjecting a portion of each of the first thermoelement wire and the second thermoelement wire to a thermal gradient of at least 60° C. during operation of the thermocouple junction.

4. The method of claim 1, wherein exposing the thermocouple junction comprising the first thermoelement wire and the second thermoelement wire to the temperature comprises exposing an entire length of the first thermoelement wire and the second thermoelement wire to the temperature.

5. The method of claim 1, further comprising:
   disposing the first thermoelement wire and the second thermoelement wire in respective apertures of an electrically insulating material;
   swaging a metallic tube on the first thermoelement wire and the second thermoelement wire to form the thermocouple junction therebetween; and
   disposing the first thermoelement wire, the second thermoelement wire, and the thermocouple junction in a sheath.

6. The method of claim 5, wherein exposing the thermocouple junction comprising the first thermoelement wire and the second thermoelement wire to the temperature further comprises exposing the thermocouple junction comprising the first thermoelement wire, the second thermoelement wire, and the sheath to the temperature.

7. The method of claim 1, further comprising selecting the first thermoelement wire comprising between 0.5 percent by weight and 1.0 percent by weight of lanthanum oxide and between 98.95 percent by weight and 99.45 percent by weight molybdenum.

8. The method of claim 1, further comprising selecting the second thermoelement wire comprising between 99.5 percent by weight and 99.8 percent by weight niobium and between 490 parts-per-million and 1,000 parts-per-million phosphorus.

9. The method of claim 1, wherein exposing the thermocouple junction comprising the first thermoelement wire and the second thermoelement wire to the temperature until the rate of change of the normalized voltage output of the first thermoelement wire and the second thermoelement wire is 0.001 normalized Volts per hour or less than 0.001 normalized Volts per hour comprises exposing the thermocouple junction comprising the first thermoelement wire and the second thermoelement wire to the temperature until the rate of change of the normalized voltage output of the first thermoelement wire and the second thermoelement wire is between 0.001 normalized Volts per hour and 0.0001 normalized Volts per hour.

10. The method of claim 1, wherein exposing the thermocouple junction comprising the first thermoelement wire and the second thermoelement wire to the temperature until the rate of change of the normalized voltage output of the first thermoelement wire and the second thermoelement wire is 0.001 normalized Volts per hour or less than 0.001 normalized Volts per hour comprises exposing the thermocouple junction comprising the first thermoelement wire and the second thermoelement wire to the temperature for a duration in a range extending from 4 hours to 6 hours.

11. The method of claim 1, wherein exposing the thermocouple junction comprising the first thermoelement wire and the second thermoelement wire to the temperature comprises exposing the thermocouple junction comprising the first thermoelement wire and the second thermoelement wire to a temperature between 50° C. and greater than a maximum intended operating temperature of the thermocouple.

12. The method of claim 1, wherein exposing the thermocouple junction comprising the first thermoelement wire and the second thermoelement wire to the temperature in the range extending from 50° C. to 60° C. above the intended operational temperature of the first and second thermoelement wires comprises exposing the thermocouple junction comprising the first thermoelement wire and the second thermoelement wire to a temperature in a range extending from 1150° C. to 1650° C.

13. A method of heat-treating a thermocouple, comprising:
measuring an output voltage of a thermocouple while exposing a first thermoelement wire and a second thermoelement wire to a temperature between 50° C. to 60° C. above a predetermined operational temperature of the first and second thermoelement wires; and
maintaining the first thermoelement wire and the second thermoelement wire exposed to the temperature until a rate of change of a normalized voltage output of the first thermoelement wire and the second thermoelement wire is between 0.001 normalized Volts per hour and 0.0001 normalized Volts per hour.

14. The method of claim 13, wherein exposing the first thermoelement wire and the second thermoelement wire to the temperature comprises exposing the first and second thermoelement wires to a temperature of 1650° C.

15. The method of claim 13, further comprising:
disposing the first thermoelement wire and the second thermoelement wire in respective apertures of an electrically insulating material;
swaging a metallic tube on the first thermoelement wire and the second thermoelement wire to form a thermocouple junction therebetween; and
disposing the first thermoelement wire, the second thermoelement wire, and the thermocouple junction in a sheath.

16. The method of claim 13, wherein exposing the first thermoelement wire and the second thermoelement wire to the temperature until the rate of change of the normalized voltage output of the first thermoelement wire and the second thermoelement wire is between 0.001 normalized Volts per hour and 0.0001 normalized Volts per hour comprises exposing the first thermoelement wire and the second thermoelement wire to the temperature for a duration in a range extending from 4 hours to 6 hours.

17. The method of claim 13, wherein exposing the first thermoelement wire and the second thermoelement wire to the temperature comprises exposing the first thermoelement wire and the second thermoelement wire to a temperature between 50° C. and 60° C. greater than a maximum intended operating temperature of the thermocouple.

18. The method of claim 13, wherein measuring the output voltage of the thermocouple while exposing the first thermoelement wire and the second thermoelement wire to the temperature between 50° C. to 60° C. above the predetermined operational temperature of the first and second thermoelement wires comprises measuring the output voltage of the thermocouple while exposing the first thermoelement wire and the second thermoelement wire to a temperature between 1150° C. and 1650° C.

19. A thermocouple subjected to a method of heat treating, the method comprising:
exposing a thermocouple junction comprising a first thermoelement wire and a second thermoelement wire to a temperature in a range extending from 50° C. to 60° C. above an intended operational temperature of the first and second thermoelement wires and until a rate of change of a normalized voltage output of the first thermoelement wire and the second thermoelement wire is 0.001 normalized Volts per hour or less than 0.001 normalized Volts per hour, wherein the first thermoelement wire comprises a molybdenum-lanthanum based material and the second thermoelement wire comprises a phosphorus-doped niobium.

20. The thermocouple of claim 19, wherein exposing the thermocouple element junction comprising the first thermoelement wire and the second thermoelement wire to the temperature in the range extending from 50° C. to 60° C. above the intended operational temperature of the first and second thermoelement wires comprises exposing the thermocouple element junction the first thermoelement wire and the second thermoelement wire to a temperature in a range extending from 1150° C. to 1650° C.

* * * * *